(12) United States Patent
Bernacki et al.

(10) Patent No.: US 6,445,667 B1
(45) Date of Patent: Sep. 3, 2002

(54) OPTICAL SERVO WRITING

(75) Inventors: Bruce E. Bernacki, Layton, UT (US); George T. Krieger, Carmel, CA (US); Fred C. Thomas, III, Ogden, UT (US)

(73) Assignee: Iomega Corporation, UT (US)

( * ) Notice: Subject to any disclaimer, the term of this patent is extended or adjusted under 35 U.S.C. 154(b) by 0 days.

(21) Appl. No.: 09/613,936

(22) Filed: Jul. 11, 2000

(51) Int. Cl.$^7$ ................................. G11B 7/00
(52) U.S. Cl. ...................................... 369/100
(58) Field of Search ............... 369/47.27, 53.3, 369/275.1, 275.3, 275.4, 44.17, 98, 100

(56) References Cited

U.S. PATENT DOCUMENTS

| | | | |
|---|---|---|---|
| 4,917,462 A | 4/1990 | Lewis et al. ............... 350/319 |
| 5,105,305 A | 4/1992 | Betzig and Trautman .. 359/368 |
| 5,148,307 A | 9/1992 | Kopelman and Lewis .. 359/385 |
| 5,253,245 A | 10/1993 | Rabedeau .................. 369/119 |
| 5,334,849 A | 8/1994 | Thomas et al. ............. 250/559 |
| 5,452,285 A | 9/1995 | Monen ..................... 369/275.3 |
| 5,453,969 A | 9/1995 | Psaltis et al. ............... 369/109 |
| 5,519,679 A | 5/1996 | Gage ....................... 369/44.34 |
| 5,533,042 A | 7/1996 | Fukunaga et al. ........... 372/50 |
| 5,574,742 A | 11/1996 | Ben-Michael and Koren ... 372/45 |
| 5,608,710 A | 3/1997 | Minemura et al. .......... 369/116 |
| 5,615,050 A | 3/1997 | Kant ........................ 359/711 |
| 5,637,907 A | 6/1997 | Leedy ....................... 257/434 |
| 5,691,541 A | 11/1997 | Ceglio et al. ............. 250/492.1 |
| 5,792,674 A | 8/1998 | Kitamura .................... 438/31 |
| 5,793,913 A | 8/1998 | Kovacic ...................... 385/49 |
| 5,870,176 A | 2/1999 | Sweatt et al. ................ 355/53 |
| 5,881,042 A | 3/1999 | Knight ....................... 369/99 |
| 5,888,680 A | 3/1999 | Ohbayashi et al. .......... 430/19 |
| 5,909,614 A | 6/1999 | Krivoshlykov ............... 438/29 |
| 6,339,569 B1 * | 1/2002 | Liu et al. ................. 369/44.27 |

* cited by examiner

Primary Examiner—Nabil Hindi
(74) Attorney, Agent, or Firm—Woodcock Washburn LLP

(57) ABSTRACT

The present invention relates to a method for servo writing an optical or magneto-optical medium where a data path is defined by transmitting a laser beam onto the medium to change the crystalline structure at preselected portions. These portions can guide an optical head along the data path. Embodiments include using a far-field laser servo writer to transmit a laser beam in combination with a high numerical aperture, using a far-field laser servo writer to transmit a laser beam in combination with a solid immersion lens, using a near-field laser servo writer to emit a laser beam in combination with a solid immersion lens, creating a sub-wavelength aperture for emitting a laser beam onto the medium, lithographic and maskless lithographic techniques. The present invention also relates to a medium for the storage of data which has portions of its substrate with a different crystalline structure than the rest of the substrate of the medium, so that these portions of the substrate can serve as optically created servo fields for a tracking device.

38 Claims, 15 Drawing Sheets

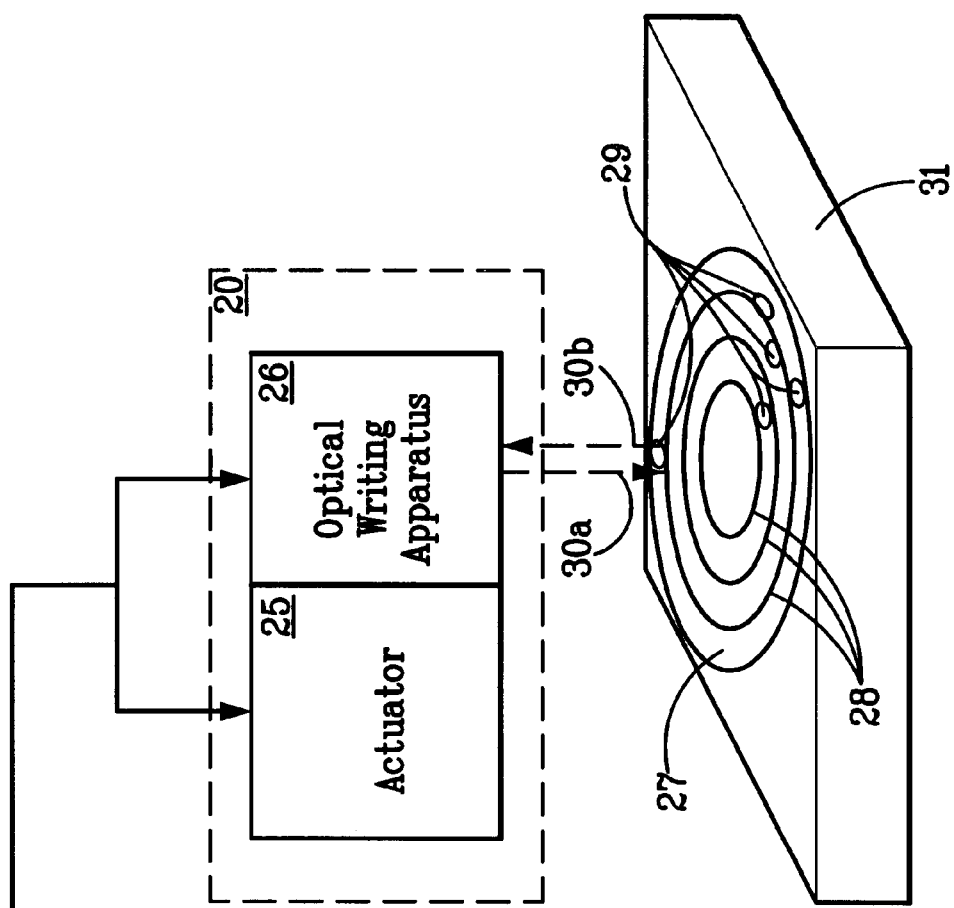
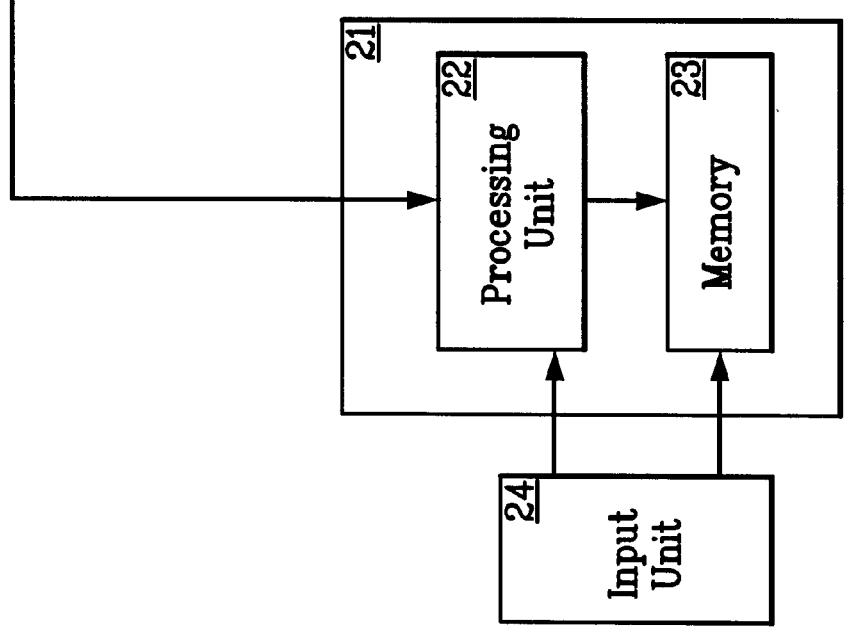
FIG. 2

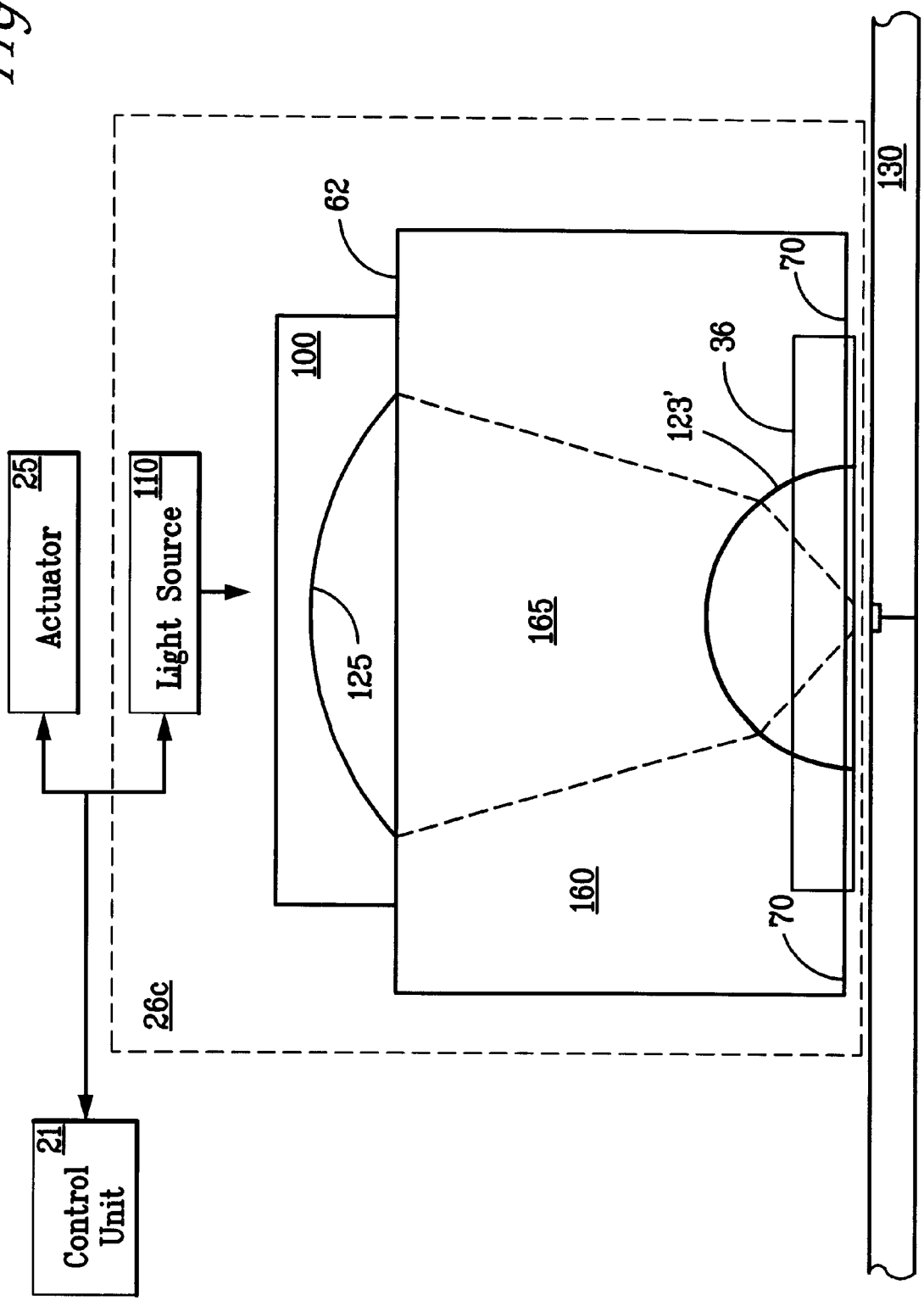

OPTICAL SERVO WRITING

BACKGROUND OF THE INVENTION

1. Field of the Invention

The present invention relates to optical media for the storage of data, and more particularly to a method for optical writing servo fields on an optical medium by changing an optical quality of the optical medium.

2. Brief Description of Prior Developments

Optical media that store data along tracks have required methods for keeping a tracking head aligned with the center of a track, so that errors in reading and writing data do not occur.

Previously, conventional far-field optical data storage and tracking methods have predominantly used the continuous composite servo (CCS) approach. CCS is an analog method in which continuous tracking data is extracted from information concerning light diffracted from grooves positioned in relation to the tracks. In a continuous feedback fashion, data from the light diffracted by the grooves indicates to a control circuit where the tracking head should move in order to read the track most effectively.

Another previous method is the sampled-servo method. In this method, embossed pits are positioned into the surface of the optical medium in relation to the center of data tracks also for the purpose of providing tracking information. As the read/write head reads data, it also passes over the areas where the embossed pits have been positioned. If a signal is received by a servo controller corresponding to these servo fields, then the servo controller directs the head back to the center of the track. By encoding the servo fields differently than the data along the tracks, e.g., by encoding the servo fields with different frequency information than the data track, the read/write head not only can read data, but also can reveal information to the controller about its position with respect to the servo fields. In this fashion, tracking may be accomplished even in a near-field optical system.

However, recent approaches to high density optical recording employing near-field methods and other methods tending to reduce the spot size of a laser beam have emphasized the need for novel approaches for following a track on an optical medium. As tracks on an optical medium become thinner in the radial direction due to new capabilities and advances, correspondingly, the beneficial result is that the tracks can be placed closer together. Accordingly, the tolerance and precision of a tracking head in tracking must also increase. The CCS method generally can not be implemented because it is inherently a far-field approach requiring both a servo detection path and a data detection path. As spot size is decreased, the illumination on the optical disk may not be wide enough to encompass both information from the data track and information from adjacent grooves. Accordingly, the CCS method may not be applicable to these near-field approaches. In any event, the dual data path increases both manufacturing time and cost.

Thus, for some near-field approaches, the sampled-servo method has advantages because these approaches utilize the tracking head as both the writing and detection mechanism. Without a mechanism to monitor the diffraction of light from grooves, the sampled-servo method has been the only alternative. However, the sampled-servo method is not without disadvantages. The addition of embossed pits can decrease the overall data storage capacity of the optical medium because an embossed pit has inherent thickness. Also, in a stamping/replicating process, essentially a master stamping disk is produced bearing a template of the optical servo pattern. This master disk is then pressed against the optical disk under a pressure of several tons per square inch. The significant amount of pressure transfers the servo track pattern from the master disk to the medium. The stamping, or replication processes, however, have an associated yield due to such phenomena as stamper wear, injection mold deformation or other imperfect replication steps. To ensure quality, the sampled-servo method requires additional manufacturing steps, thus increasing the time and cost of producing the optical medium.

Furthermore, embossing pits into a sensitive optical medium creates cavities into the surface of the optical medium. This allows for particles, such as dust and other debris particles, to accumulate and become embedded into the pits which can degrade a tracking signal, and decrease the overall accuracy of reading or writing data.

In addition, if a disk is not hubbed before it is servo written, there is increased probabililty that errors in $1f$ runout will occur due to hubbing errors. These hubbing errors require adaptive algorithms using digital signal processing hardware which creates additional design and cost expense for a disk drive. On the other hand, by providing a system where the disk can be hubbed first, and then optically servo written, the disk tracks and corresponding optical servo fields are concentric with the hub or center of the optical medium.

Moreover, the ability to produce servo fields that correspond exactly to the optical property exploited for signal detection is advantageous. By example, magneto-optical drives detect data by sensing the rotation of polarization due to the Kerr effect. Detection of servo fields is accomplished by detecting the difference in reflectivity from the disk due to the destructive interference caused by a pit written to be one-quarter of a wavelength in depth. The drive therefore must switch between two detection modes when transitioning from data to sector areas.

In contrast, for phase-change recording, a short (less than 100 ns) burst of laser light converts a tiny spot on the medium's highly reflective crystalline surface to the less reflective amorphous, or semicrystalline state, the conversion occurring upon rapidly heating the material to a temperature above its melting point, then rapidly quenching it, "freezing" it into the amorphous state. Restoring the storage medium to its original state is done by heating the bit locations to a temperature below the material's melting point, but for an "extended" period of time (on the order of $10^{-5}$s).

However, a spot on a medium's crystalline surface can also be differently, "permanently" or irreversibly written. For example, "Laser-Induced Multiple Phase Transitions in Ge-Te Films Traced by Time-Resolved TEM," by O. Bostanjoglo and P. Thomsen-Schmidt, Applied Surface Science, Elsevier Science Publishers, pp. 136–141 (1989), illustrates that several different phase structures may be generated for at least one phase changed media composition. In a relevant portion, the article states that complex multiple phase transitions were found by time resolved (TEM) to proceed in laser pulse-annealed Ge-rich GeTE films.

Additionally, "Progress of Erasable Phase-Change Materials," by M. Chen and K. A. Rubi, S.P.I.E. Vol. 1078—Optical Data Storage Topical Meeting, pp. 150–156 (1989), discusses both a metastable and stable crystalline phase for certain optical storage media. The article states that the activation energy barrier between the metastable and the stable crystals is usually very high, and data stability at ambient temperatures is not expected to be a problem. For further background, Progress of Phase-Change Single-Beam Overwrite Technology," by Trao et al., S.P.I.E. Vol. 1078—Optical Data Storage Topical Meeting, pp. 2–10 (1989), explains the process and characteristics of graying of the media, such that the gray portions can not be reversibly changed back to the crystalline state. The article discusses that the diffusion length of atoms in optical media may be altered (longer diffusion lengths) for the amorphous state so that the transition to the crystalline state correspondingly becomes longer. This diffusion length alteration may be effected, for example, with multiple overwrites and/or increased amorphization heating periods.

These techniques, however, have not been applied to create optical servo marks on an optical medium; and as the above background description discusses, there is still a need in the art for a mechanism or method for optically servo writing an optical medium. As the detailed description of preferred embodiments will illustrate, the present invention provides a method for optical servo writing and/or tracking servo fields for savings in efficiency, cost and/or time over the servo writing techniques of the prior art.

SUMMARY OF THE INVENTION

The present invention provides optical methods for servo writing and reading servo fields in optical media for savings in efficiency, cost and/or time. The present invention implements techniques for changing the crystalline structure of an optical or magneto-optical medium to create optical servo fields. By transmitting a laser beam onto an optical or magneto-optical medium, the crystalline structure is altered at the portions of the substrate of the medium preselected for servo fields. These techniques create optical servo fields and include near-field and far-field laser techniques, different types of lenses, different types of techniques for providing sub-wavelength apertures on a laser-emitting device, lithographic methods and maskless lithography.

The present invention also relates to an optical medium for the storage of data which has portions of its substrate with a different crystalline structure than the rest of the substrate of the optical medium, so that these portions of the substrate can serve as optically created servo fields for a tracking device.

DETAILED DESCRIPTION OF THE DRAWINGS

The method for servo writing an optical medium and the optical medium are further described with reference to the accompanying drawings in which:

FIG. 2 represents a block diagram of an optical servo writing system in accordance with the present invention.

FIG. 4 represents an embodiment of the present invention for optically writing servo fields employing a solid immersion lens in a near-field regime.

FIG. 5I represents the optical writing of servo fields using an optical writing apparatus with a sub-wavelength aperture having a non-uniform face in a near-field regime.

DETAILED DESCRIPTION OF PREFERRED EMBODIMENTS

Figure 1A:
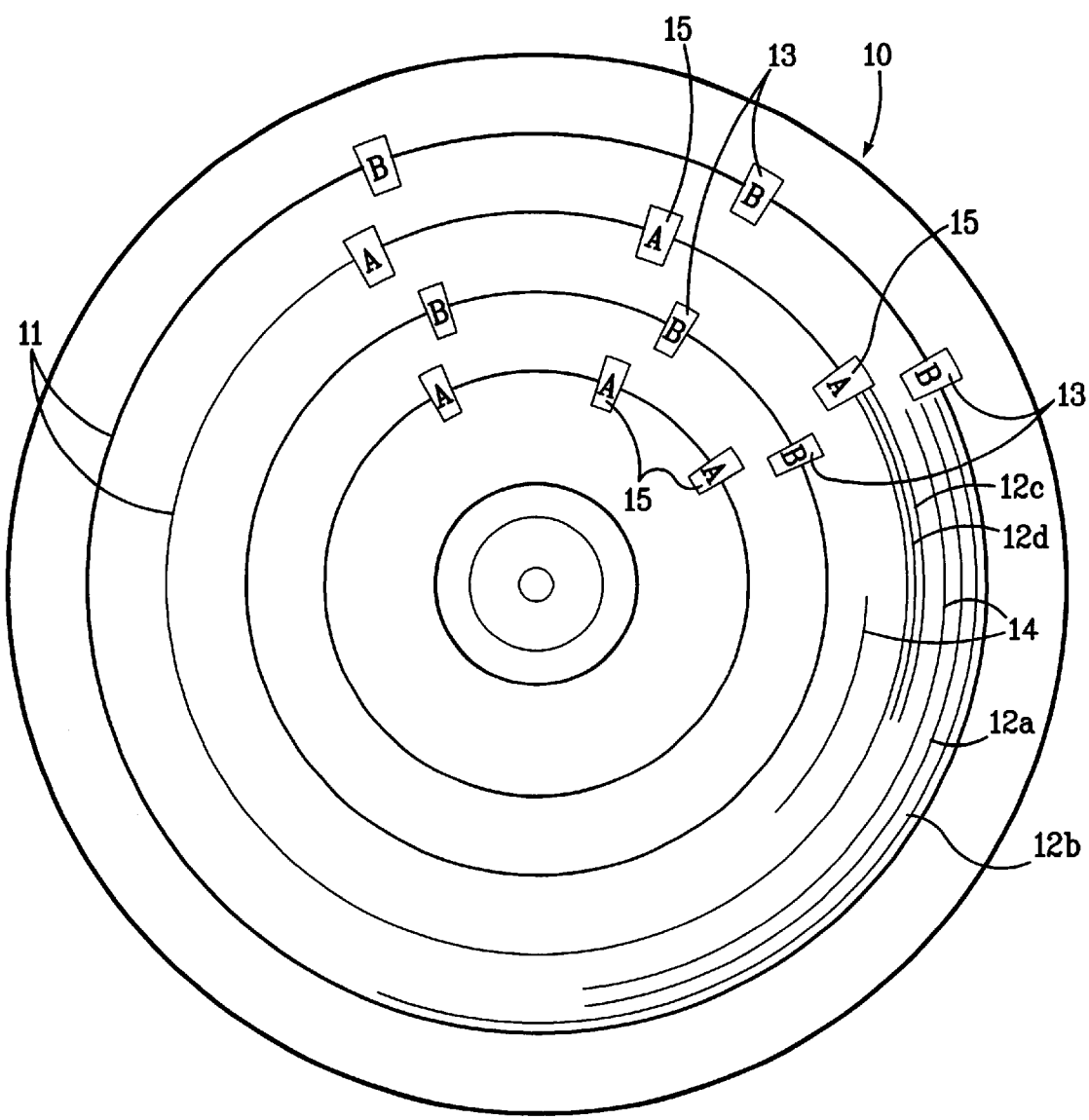
FIG. 1A represents a top view of an optical medium in accordance with the present invention.

A spot on a medium's crystalline surface can be differently, "permanently" or irreversibly written, for example, by using laser power of very high intensity. As related in the background, several different phase structures may be generated for certain phase changed media compositions. For instance, laser pulse-annealed Ge-rich GeTE films can exhibit complex multiple phase transitions by time resolved TEM. Additionally, both a metastable and stable crystalline phase can exist for certain optical storage media, whereby the activation energy barrier between the metastable and the stable crystals is very high, and ambient temperatures do not cause data instability. Furthermore, a process for graying a medium exists, such that the gray portions may not be reversibly changed back to the crystalline state by the optical recording head. This may result from altering/increasing the diffusion length of atoms in the optical media when in the amorphous state so that the transition to the crystalline state correspondingly becomes longer. In this regard, exemplary alteration techniques include multiple overwriting and/or the utilization of increased amorphization heating periods.

Thus, in accordance with the present invention, an optical phase change type media may be formulated having a tertiary state characteristic, whereby the thermal phase of a location on the media may be cycled through three states. The media may also have three different reflectivities associated with the different phases. The third state may then be used as servo mark indicia.

For example, today's commercial media commonly employ two phases: an amorphous and a crystalline phase, and the optical heads operate accordingly. However, a second amorphous or crystalline phase can also be attained as a third phase, and in conjunction with changing the thermal cycling of the recording apparatus, the third phase may function to distinguish associated portions of the optical media. In accordance with a preferred embodiment of the present invention, the third phase has a significantly different thermal cycling for purposes of reversing the phase or the third phase when obtained is irreversible. This property allows servo fields to be produced that are not destroyed by off-track shock events when data is being written to the medium by the recording head, since the third phase is unaffected by recording head write attempts.

Techniques for generating servo portions, having the characteristics of a third phase in accordance with the present invention, include using an optical recording apparatus at high power servo writer setting to write stable crystalline servo marks and/or using faster transitioning/lower power metastable crystalline phase for data. The new/third phase may be characterized as an "over-amorphized" phase and was previously a characteristic media developers worked to rid from their systems. However, in accordance with the teachings of the present invention, the third phase may serve as a basis for an optical servo field and thus techniques for generating the super-amorphized phase, once avoided, are instead quite useful.

Thus, the present invention relates to a system that writes optical servo fields to a phase change media wherein a third state of the optical media, with different optical characteristics than the traditionally used amorphous and crystalline states, is used as a characteristic of the servo field. More specifically, the present invention relates to a system that writes stable crystalline servo marks with a high power servo writer and/or uses the quicker transitioning/lower power metastable crystalline phase for data.

There is known in the art an effect whereby portion(s) of a medium can wear out after approximately 1 million phase change cycles. As mentioned, while traditionally avoided, this process can also be intentionally performed in order to create optical servo fields. An acceleration of this wear out process may be effected by using a longer power duration and/or higher power intensity during the servo write process. As explained above, this accelerates the wear out mechanism for phase change media by creating an amorphous state with longer diffusion lengths.

The invention described herein pertains to the laser writing of servo fields or marks on phase change or magneto-optical media having either flexible or rigid substrates. In addition to other herein-mentioned examples, examples of such flexible substrates include PET or PEN substrates. Examples of such rigid substrates include ceramic glass, polycarbonate, cyclic polyolefin and various other plastic substrates.

An example of an optical disk with servo fields and data tracks is depicted in FIG. 1A. Optical disk 10 has data tracks 14 positioned radially from the center of the optical disk 10. Positioned on one side of the data tracks 14 are servo fields 15 and on the other side of data tracks 14 are servo fields 13. Servo fields 13 and servo fields 15 are positioned along concentric circles 11.

Figure 1B:
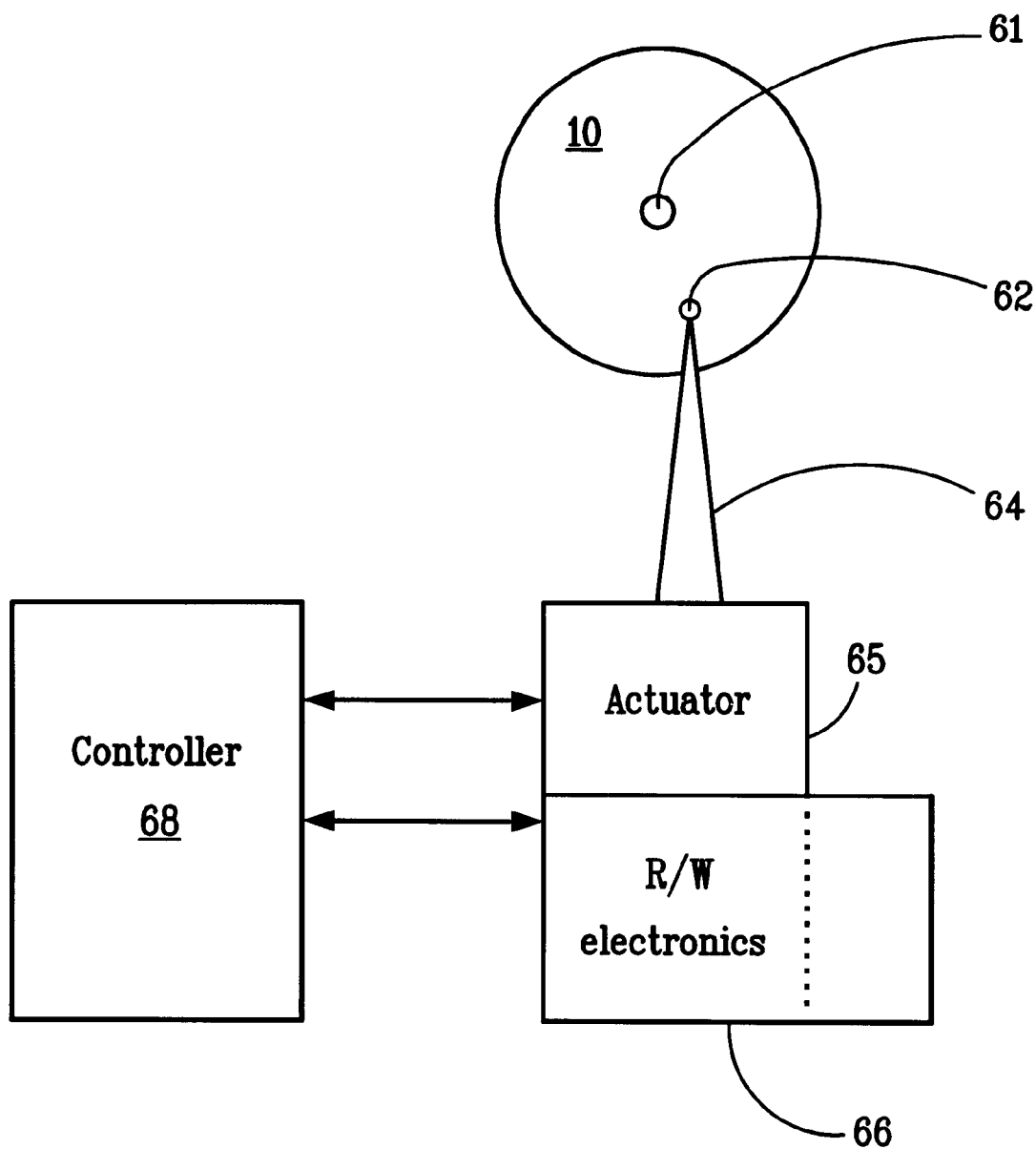
FIG. 1B represents a block diagram of the operation of tracking on an optical medium with servo fields.

With additional reference to FIG. 1B, the operation of a tracking system for tracking data tracks 14 using servo fields is illustrated. A head 62 having an arm 64 can be moved generally radially inward or outward relative to optical disk 10 having center 61 by an actuator 65. Information from the head 62 is sent to read/write electronic circuitry 66 or information can be sent from read/write electronic circuitry 66 to head 62. Information regarding the position of the head can also be communicated from the read/write electronic circuitry 66 to controller 68. Controller 68 also communicates to read/write electronic circuitry 66 information such as whether to read or write and other data. Controller 68 also sends a signal to actuator 65 with information about where to move the head 62 having processed the information read from the servo fields. Actuator 65 sends feedback to controller 68 concerning the relative amount of movement completed. These are some main signal components which allow the system to operate in a feedback loop.

For example, when optical disk 10 spins on center 61, head 62 begins reading data along a data track 14. If, however, the head begins to move towards deviation line 12a, which movement can take place for a variety of reasons such as eccentricity and elliptical distortion, errors in data reading may begin to occur. Accordingly, when the head passes over servo mark 13, an information signal is conveyed via read/write electronics 66 to the controller 68 to move the head back to center line 14 via actuator 65. If the head 62 moves as far as deviation line 12b, the probability of an error in reading data increases even more and more surface area of servo mark 13 is passed over by optical head 62. When the head 62 passes over servo mark 13, an information signal reflecting the surface area passed over is conveyed to the controller 68 via read/write electronics 66. In accordance with this information signal, the controller 68 sends a signal to actuator 64 to move the head 62 back to center line 14.

This same procedure can be used when the head drifts in the other direction towards servo fields 15. If optical head 62 travels along path 12c, the optical head 62 will pass over servo mark 15. The optical head 62 will receive information corresponding to servo mark 15 and will transmit a signal via read/write electronics 66 to controller 68. Controller 68 processes the signal and outputs the amount of movement actuator 65 needs to move optical head 62 to return to data path 14. In a like fashion, if the optical head 62 drifts as far as path 12d, more surface area of servo mark 15 is passed over by the optical head 62, and accordingly read/write electronics 66 read a signal corresponding to the greater amount of surface area of servo mark 15 passed over. Read/Write electronics 66 convey this signal to controller 68, which processes the signal and sends a signal to actuator 65 indicative of the distance optical head 62 needs to move to return to data path 14. Servo fields 13 and 15 contain different information in order to differentiate between the two directions of head drift that can occur, so that the controller 66 can indicate to the actuator 65 which direction to move head 62. In this manner, a feedback system is in place to keep the head 62 in the center of track 14 so that errors in data reading or writing do not occur.

FIG. 1A shows servo fields 13 and 15 positioned in a manner to allow dual usage by adjacent tracks 14. As optical head 62 travels from one data track 14 to an adjacent data track 14, the directional information sent to actuator 65 from controller 66 changes. Although servo mark 15 in the above description indicated a directional shift of optical head 62 radially outward, on the adjacent track 14, servo mark 15 will indicate a directional shift of optical head 62 radially inward. This, however, is one embodiment shown for illustrative purposes of a system for reading and writing data tracks 14 on an optical medium. Servo fields 13 and 15 need not operate for two adjacent tracks. Servo fields can be placed anywhere on a medium, in a continuous or discontinuous manner, so that an optical head can detect a deviation from data tracks 14.

As discussed previously, conventional methods of tracking data without error present drawbacks in view of recent advancements in near-field optical methods and other methods tending towards high density recording. Thus, in one aspect of the present invention, it is advantageous to provide a method for placing servo fields on optical media without master stamping/replicating. In another aspect of the present invention, it is advantageous to create optical servo fields by changing the crystalline structure of portions of the substrate of an optical medium with a laser servo writer.

There are numerous optical apparatuses and servo writing techniques that may be utilized in connection with the optical servo writing of the present invention. While various preferred embodiments are described and shown herein, the present invention may be implemented with any apparatus conducive to the generation of portion(s) of a medium having a third state whereby the write operations of the system's recording head do not affect the portion(s) having the third state.

With reference to FIG. 2, a method according to the present invention is illustrated. A user inputs into input unit 24 particular parameters to give instructions for a laser servo writing apparatus 20. Input unit 24 can be a keyboard, a microterminal, a touch screen, a mouse-screen interface, buttons, switches or any other commonly employed user interface.

The instructions of input unit 24 indicate to the optical writing apparatus what kind of laser beam 30a to transmit and when to transmit. For example, a laser beam's frequency content can be modulated with instructions input into input unit 24. As another example, the intensity of a laser beam can be changed with inputs into input unit 24. Based upon the type of resultant servo fields a user wants to create, these instructions conform the laser beam 30a to preselected parameters. Additionally, the positions of the servo fields can be controlled with input to input unit 24. Ultimately, the position input will instruct actuator 25 when and where to move optical writing apparatus 26 and instruct optical writing apparatus 26 when to transmit a laser beam 30a onto the optical medium. These inputs are examples of the type of information a user would input for flexibility in the creation of servo fields.

Once input unit 24 contains instructions concerning the creation of servo fields, input 24 outputs these instructions as an electrical signal to processing unit 22. Processing unit 22 could be a microprocessor, central processing unit of a computer, or other circuitry for the conversion of input signals into a control signal. Processing unit 22 communicates via a communication bus with memory 23, for purposes of obtaining prestored values and storing information relating to the operation of the laser servo writing apparatus 20. Together, the processing unit 22 and memory 23 constitute a control unit 21. Control unit 21 could be a computer, microprocessor assembly or other architecture capable of storing and retrieving preselected values and processing input signals into control signals. Control unit 21 additionally has inputs from the laser servo writing apparatus to effect a feedback loop to accurately position servo fields.

Having processed input from input unit 24, control unit 21 outputs a control signal to laser servo writing apparatus 20. This control signal consists of two main components: a signal for controlling actuator 25 and a signal for controlling optical writing apparatus 26. Actuator 25 moves optical writing apparatus 26 in order to position the laser beam 30a to create a servo field at a preselected position. The signal from control unit 21 to actuator 25 controls the positioning of optical writing apparatus 26. The signal from control unit 21 to optical writing apparatus 26 controls when the optical writing apparatus 26 transmits a laser beam 30a. This signal from control unit 21 also controls what kind of laser beam 30a transmits. Actuator 25 sends a feedback signal relating to the position of the optical writing apparatus 26 to control unit 21. Reflected laser beam 30b is received by optical writing apparatus 26, and a signal is transmitted to control unit 21 relating to the properties of reflected light 30b. In this manner, this embodiment of an optical servo writing system employs feedback from the actuator 25, optical writing apparatus 26 in conjunction with preselected inputs to position an optical writing apparatus 26 to write optical servo fields 29. With control of the optical writing apparatus 26, laser beam 30a can accurately write optical servo fields 29 onto an optical medium 27 having data storage tracks 28. Optical medium 27 can either be held in place by a disk holder 31 and in other embodiments of the present invention, disk holder 31 spins optical medium 27 about its center in the plane of the optical medium 27.

Figure 3A:
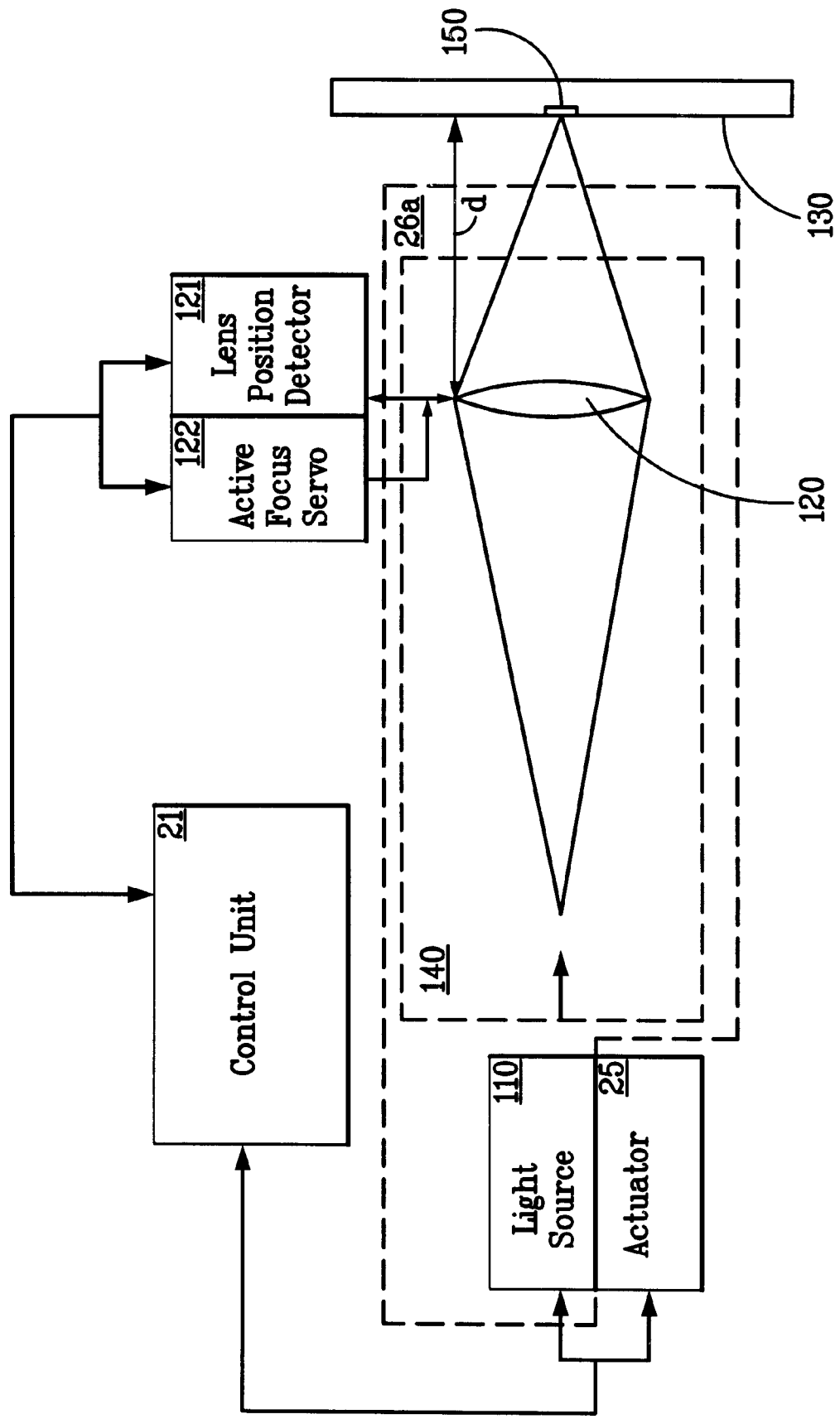
FIG. 3A represents an embodiment of the present invention for optically writing servo fields employing a high numerical aperture lens in a far-field regime.

In one embodiment of the present invention, a far-field laser servo writer is used in combination with a high numerical aperture focusing lens to achieve very small spot sizes for increased accuracy in the creation of a servo field. FIG. 3A illustrates the use of a far-field laser servo writer with a high numerical aperture focusing lens. Light source 110 and optical path control window 140 comprise optical writing apparatus 26a. Control unit 21 instructs light source 110 and actuator 25 according to input parameters and feedback as described above to position optical servo fields on optical medium 130. Light source 110 is directed towards a high numerical aperture focusing lens 120. Lens 120 acts to focus the distant light to a very small spot size on the optical medium 130 for purposes of laser heating its surface. Light source 110 is preferably a blue gas laser, and more preferably a HeCD or Ar$^+$ laser. Light source 110 can be modulated with an acousto-optical modulator, an electro-optical modulator or other well-known methods of modulating the frequency content of a laser beam. The result is that optical servo mark 150 on optical medium 130 is created by the focusing of light source 110 by high numerical aperture focusing lens 120. Additional optical equipment and devices can be used with lens 120 before or after lens 120 in optical path control window 140 for additional control of the light source 110. The path of the light source need not be linear. Mirrors and optical waveguides can be used to construct a light source path that reflects at an angle or bends. Beam splitters can also be used for additional diversion of an optical signal and polarizers can be used to polarize the light source.

A lens position detector 121 additionally outputs a signal to control unit 21. Control unit 21 processes this signal and correspondingly outputs another signal to active focus servo 122 to maintain lens 120 at a focal distance d from optical medium 130. Focal distance d can be input as a parameter or stored in the memory of the control unit 21. In this fashion, high numerical aperture focusing lens 120 can be maintained at a steady focal distance d, and a uniform spot size on optical medium 130 and an accurate positioning of optical servo field 150 can thereby be obtained.

Figure 3B:
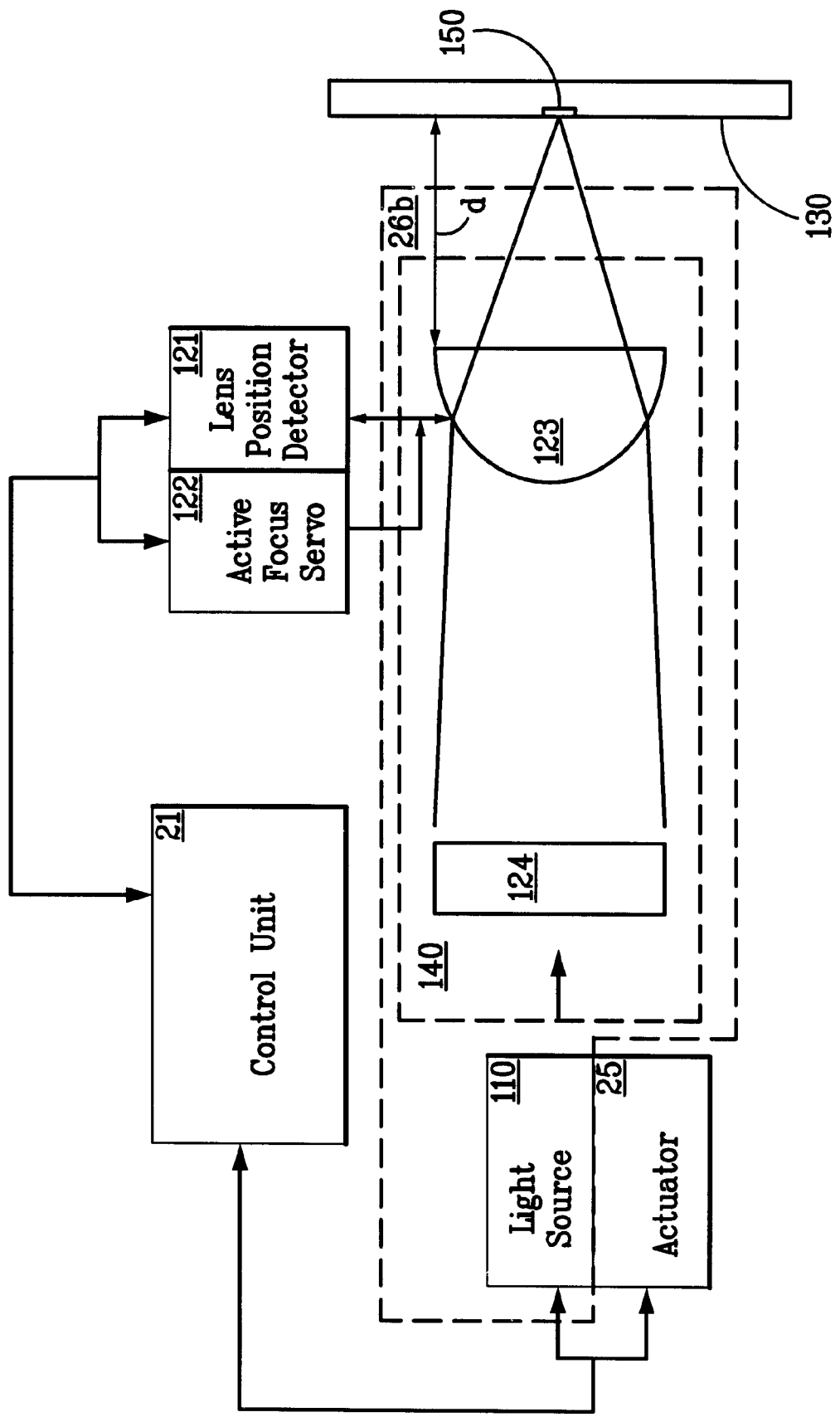
FIG. 3B represents an embodiment of the present invention for optically writing servo fields employing a solid immersion lens in a far-field regime.

In another embodiment of the present invention, a far-field laser servo writer is used in combination with a solid immersion lens to achieve very small spot sizes for increased accuracy in the creation of an optical servo field. FIG. 3B Illustrates the use of a far-field laser servo writer with a solid immersion lens. Light source 110 and optical path control window 140 comprise optical writing apparatus 26b. Control unit 21 instructs light source 110 and actuator 25 according to input parameters and feedback as previously described to position optical servo fields on optical medium 130. Light source 110 is directed towards a solid immersion lens 123. Lens 123 acts to focus the distant light to a very small spot size on the optical medium 130 for purposes of laser heating its surface. Light source 110 is preferably a blue gas laser, and more preferably a HeCD or $Ar^+$ laser. Light source 110 can be modulated with an acousto-optical modulator, an electro-optical modulator or other well-known methods of modulating the frequency content of a laser beam. The result is that optical servo mark 150 on optical medium 130 is created by the focusing of light source 110 by solid immersion lens 123. Additional optical equipment and devices can be used with solid immersion lens 123 in optical path control window 140 for additional control of the light source 110. For example, an additional lens 124 can be placed between light source 110 and solid immersion lens 123. Lens 124 is preferably an objective lens. Also, as with most optical systems, the path of the light source need not be linear. Mirrors and optical waveguides can be used to construct a light source path that reflects at an angle or bends. Beam splitters can also be used for additional diversion of an optical signal and polarizers can be used to polarize the light source.

A lens position detector 121 additionally outputs a signal to control unit 21. Control unit 21 processes this signal and correspondingly outputs another signal to active focus servo 122 to maintain solid immersion lens 123 at a focal distance d from optical medium 130. Focal distance d can be input as a parameter or stored in the memory of the control unit 21. In this fashion, high solid immersion lens 123 can be maintained at a steady focal distance d, and a uniform spot size on optical medium 130 and an accurate positioning of optical servo field 150 can thereby be obtained.

The solid immersion lens 123 has a partial spherical surface and a flat portion. The solid immersion lens may have the shape of a hemisphere or superhemisphere. The thickness of the hemisphere can be governed by a ratio pertaining to the radius of the sphere and the index of refraction of the material forming the solid immersion lens 123. The flat portion faces the optical medium 130.

The above method of optically writing servo fields on an optical medium using a farfield laser servo writer with a solid immersion lens can be adapted to a near-field regime as well. FIG. 4 illustrates an embodiment according to the present invention employing a solid immersion lens using near-field techniques. In the near-field regime, the distance between a top surface of the optical recording medium 130 and the air-bearing surface 70 of the optical head 62 is less than one wavelength of the incident light. Slider 160 forms a part of optical head 62 to provide stability and has air-bearing surfaces 70 and a channel surface 36. Active servo control circuitry is not required for this near-field regime because air-bearing surfaces 70 maintain an essentially constant distance between optical medium 150 and optical head 62. The air-bearing surfaces 70 maintain an essentially constant distance when the optical medium is rotating at a speed in a predetermined optimum range based upon the wavelength of the incident light and the distance between air-bearing surfaces 70 and optical medium 150. Thus, due to the geometry and spacing tolerance requirements of the near-field regime, the need for active focusing is eliminated.

In FIG. 4, a control unit communicates with a light source and an actuator 25 with feedback as afore-described to control the position of an optical writing apparatus 26c relative to optical medium 150 and to control the resulting characteristics of electromagnetic radiation from a light source 110. The light from light source 110 can pass through a series of optical controls before passing through the solid immersion lens 123'. For example, a laser beam from light source 110 can pass through a reflector 100 and an objective lens 125. Additionally, the light can pass through an optical clear path 165 so that electromagnetic radiation can be effectively transmitted between objective lens 125 and solid immersion lens 123' in either direction. This optical clear path 165 can be formed of a variety of transparent optical material e.g., air, glass, optically clear plastic, liquid, etc. Having passed through optical clear path 165, the light passes through solid immersion lens 123' and is focused on optical medium 130 to form servo field 150 by laser heating. The incident light changes the crystalline structure of the optical medium 130 and thereby creates servo field 150.

Figure 5A:
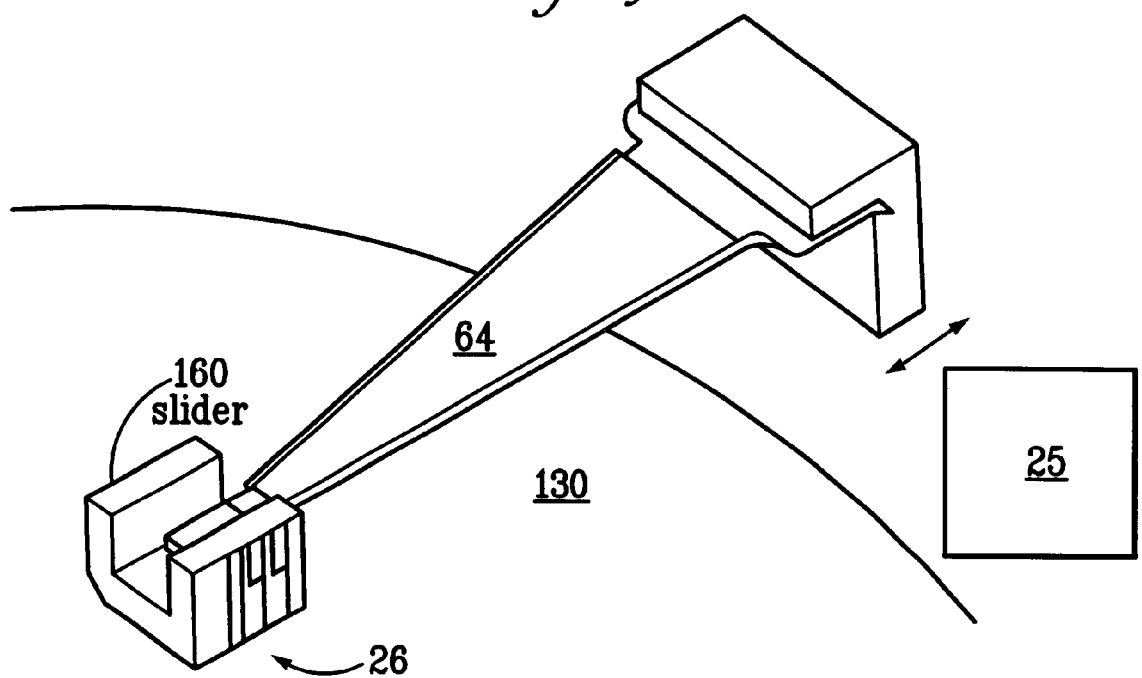
FIG. 5A represents an embodiment of the present invention for optically writing servo fields using a slider and an optical writing apparatus with a sub-wavelength aperture in a near-field regime.
Figure 5B:
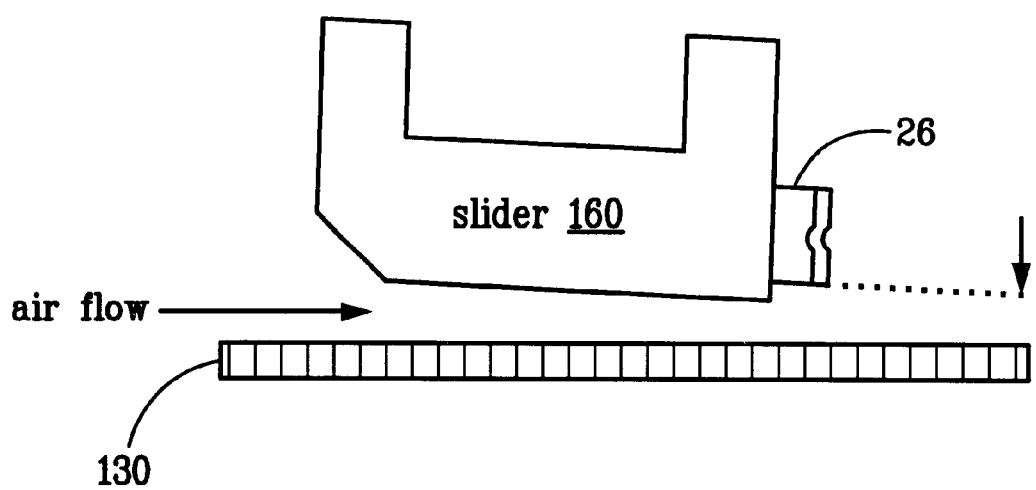
FIG. 5B represents a side view of the optical head and slider in a near-field regime.

Another method of servo writing optical servo fields according to the present invention is to use a laser diode with a sub-wavelength aperture held in close proximity with the optical medium so that near-field emission can create optical servo fields. As seen in FIG. 5A showing an optical servo writing arrangement, an optical writing apparatus 26 is moved radially across an optical medium 130 by actuator 25 translating arm 64 for the purpose of writing optical servo fields in a near-field regime. In accordance with the present embodiment, optical writing apparatus 26 has a sub-wavelength aperture for emission of a laser beam in a near-field regime. In such a near-field regime, as shown in FIG. 5B, distance s between the optical writing apparatus 26 and optical medium 130 is less than one wavelength of light, and preferably of the order of 1 µm or less. Additionally, air flows underneath slider 160 to prevent contact with the surface of optical medium 130 and to maintain steady distance s between optical writing apparatus 26 and optical medium 130.

FIG. 5I further illustrates an optical writing apparatus 26 according to a preferred embodiment. In a light emitting and receiving aperture 550 of the optical writing apparatus, there is preferably a portion with a width which is under 1 µm, below the wavelength of light being emitted. Aperture 550 can have a non-uniform emission surface for emitting a laser beam through sub-wavelength aperture 550. In this manner, very small spot sizes for optically writing servo fields on an optical recording medium 130 can be achieved.

Figure 5C:
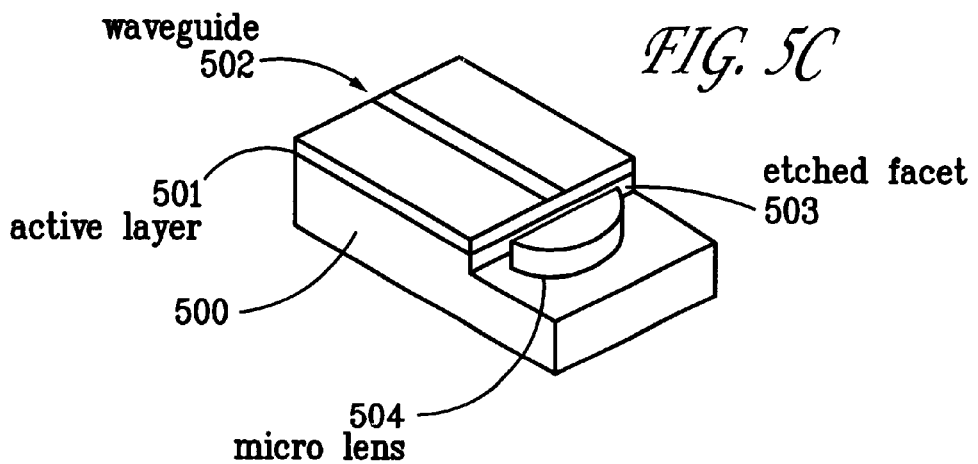
FIG. 5C represents the optical writing of servo fields using an optical writing apparatus with a sub-wavelength aperture implemented with etching.

One method of implementing a near-field laser diode with a sub-wavelength aperture is through etching the facet of a laser diode. One example of an etched faceted laser diode is illustrated in FIG. 5C. Laser diode 500 has an active layer 501 and waveguide 502. Facet 503 of laser diode 500 is etched to be non-uniform for emission of sub-wavelength electro-magnetic radiation. In this example, an additional monolithic micro lens 504 has its flat face adjacent etched facet 503. The curved surface of micro lens 504 is curved for convergence of electromagnetic radiation emitting from the etched facet 503 of laser diode 500.

Figure 5D:
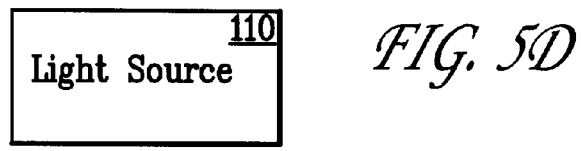
FIG. 5D represents the optical writing of servo fields using an optical writing apparatus with a sub-wavelength aperture implemented with a tapered pipette in a near-field regime.

Another method of implementing a near-field laser diode with a sub-wavelength aperture is through use of a tapered pipette. As illustrated in FIG. 5D, tapered pipette 510 is essentially a waveguide that narrows to a tip for sub-wavelength emission of electromagnetic radiation. A tapered pipette 510 is generally made from cylindrical glass tubing 511. Through a process of stretching and subsequently breaking the tubing 511 at a thin point which becomes sub-wavelength aperture 512, glass tubing 511 becomes an optical waveguide which narrows to a small aperture from a large aperture. Tapered pipette 510 can be coated with a thin metallized mask 515 terminating at sub-wavelength aperture 512. Additionally, a chemically fluorescent material layer 519 can be placed at the tip of sub-wavelength aperture 512 for additional narrowing of electromagnetic radiation from region 517.

When light source 110 emits light towards tapered pipette 510, light enters the pipette both in the glass tubing region 511 of the pipette and in the axial, circular central opening 514 as demonstrated by light 513. The light then propagates from relatively large opening 514 to very narrow portion 517. The light further propagates from tapered pipette 510 at aperture 512. The light propagating through glass tubing 511 similarly propagates towards aperture 512, but resistance is encountered due to mask 515. The mask 515 can have the primary effect of terminating and decaying propagating light along glass tubing 511, while enhancing radiation from sub-wavelength aperture 512. The tapered pipette 510 can similarly be used in the reverse direction to detect light as well e.g., reflected light.

Figure 5E:
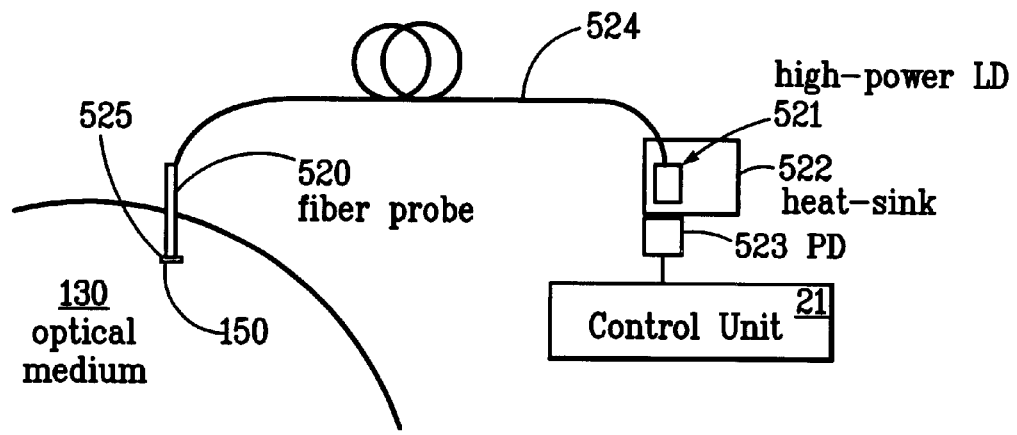
FIG. 5E represents the optical writing of servo fields using an optical writing apparatus with a sub-wavelength aperture implemented with a tapered fiber in a near-field regime.

Another method of implementing a near-field laser diode with a sub-wavelength aperture is through use of a tapered fiber. As illustrated in FIG. 5E, a fiber 524 having one end with a probe 520 having a tapered tip 525 is placed in close proximity to optical medium 130. The fiber 524 at its other end is coupled to a high powered laser diode 521. Control unit 21 also controls the emission of light onto optical medium 130 for placement of optical servo fields 150. Light propagates along fiber 524 and emits from probe 520 at tip 525 onto optical medium 130. Tip 525 also receives light for propagation towards laser diode 521 which can be detected by photo diode 523 for processing by control unit 21. In this example, the benefits of a tapered fiber 520 can be seen through the use of a high powered laser diode 521. Since the laser diode 521 itself may be placed away from the sensitive optical medium, a heat sink 522 can be employed to drain excess heat created by laser diode 521.

Figure 5F:
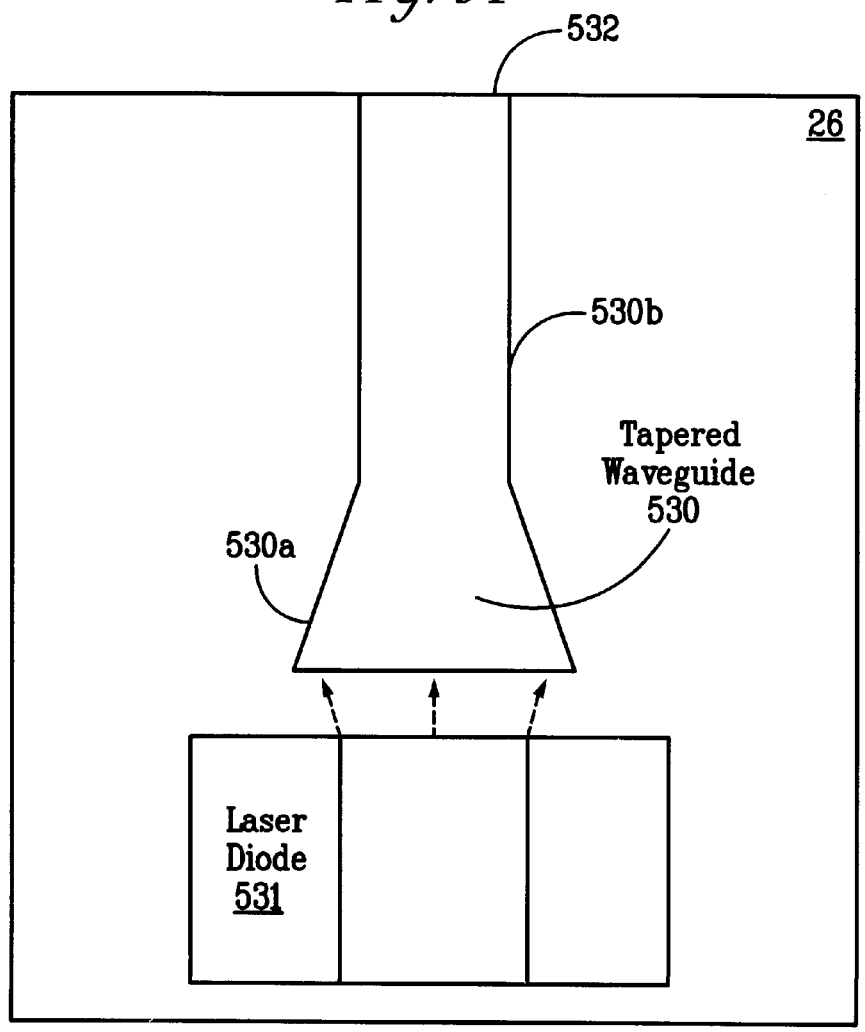
FIGS. 5F and 5G represent the optical writing of servo fields using an optical writing apparatus with a sub-wavelength aperture implemented with a tapered waveguide in a near-field regime.
Figure 5G:
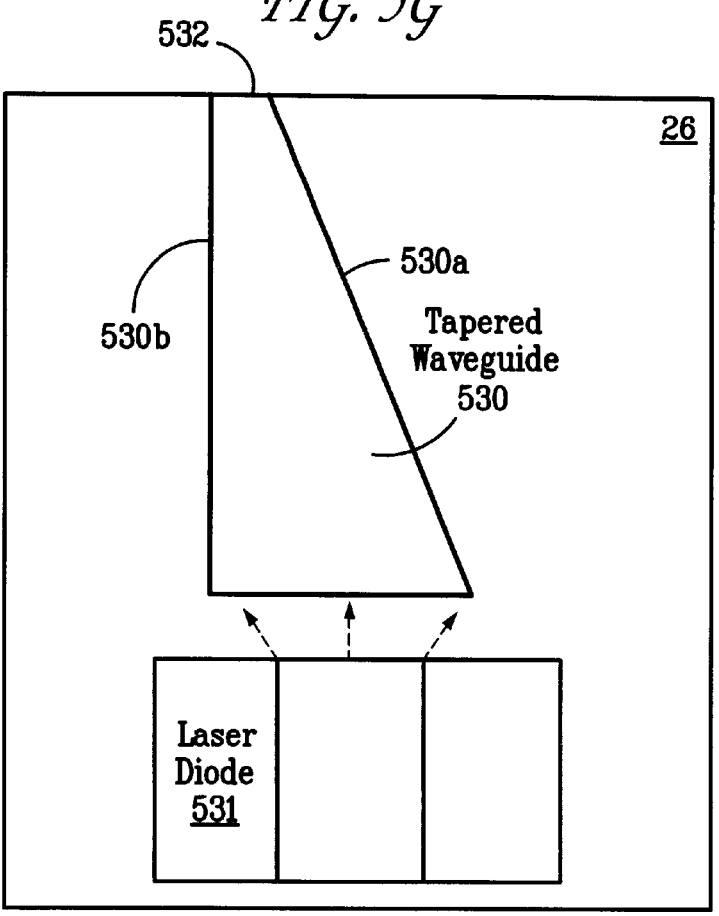

Another method of implementing a near-field laser diode with a sub-wavelength aperture is through use of a tapered waveguide. As illustrated by FIG. 5F, an optical writing apparatus 26 has a laser diode 531 which emits light towards tapered waveguide 530. Tapered waveguide 530 has a tapered portion 530a and a linear portion 530b. The path of the emitted laser beam narrows as it travels down the tapered portion 530a until the preselected emission width is achieved in linear portion 530b of tapered waveguide 530. The laser beam then exits the tapered waveguide 530 at sub-wavelength aperture 532. FIG. 5G shows another example of an optical writing apparatus 26 which uses a tapered waveguide 530 with different geometry, but generally the same operable principle. A laser beam from laser diode 531 that propagates through tapered waveguide 530 is narrowed by tapered portion 530a and guided to a proper spot size at sub-wavelength aperture 532. Linear portion 530b guides light similarly towards sub-wavelength aperture 532. By using a tapered waveguide in a near-field regime, small spot sizes capable of accurately servo writing an optical medium can be achieved.

Figure 5H:
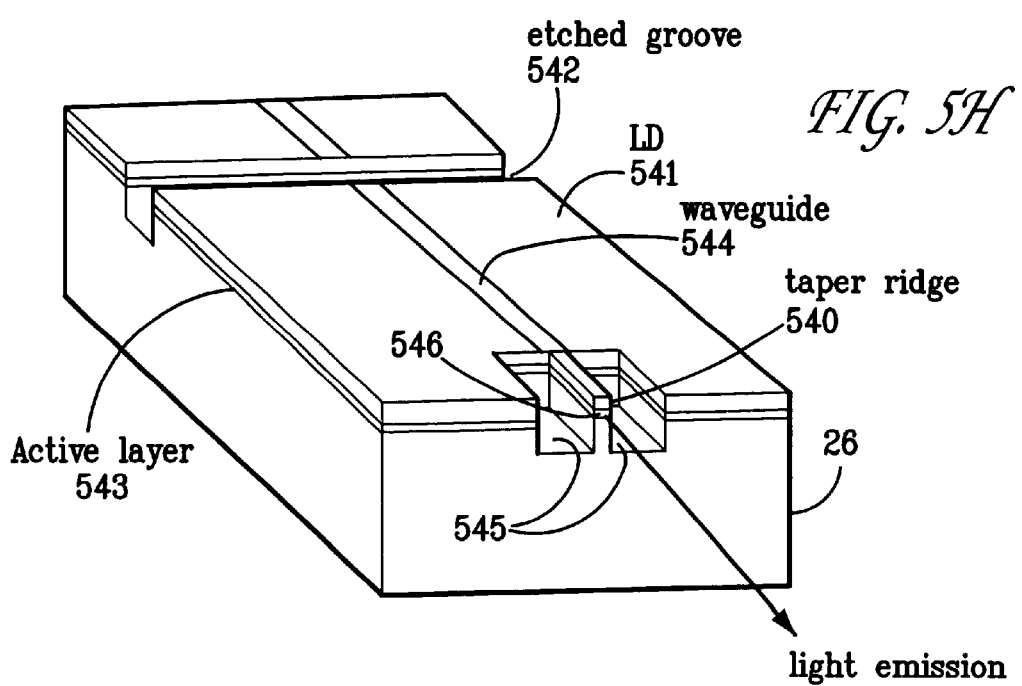
FIG. 5H represents the optical writing of servo fields using an optical writing apparatus with a sub-wavelength aperture implemented with a tapered ridge waveguide in a near-field regime.
Figure 51:
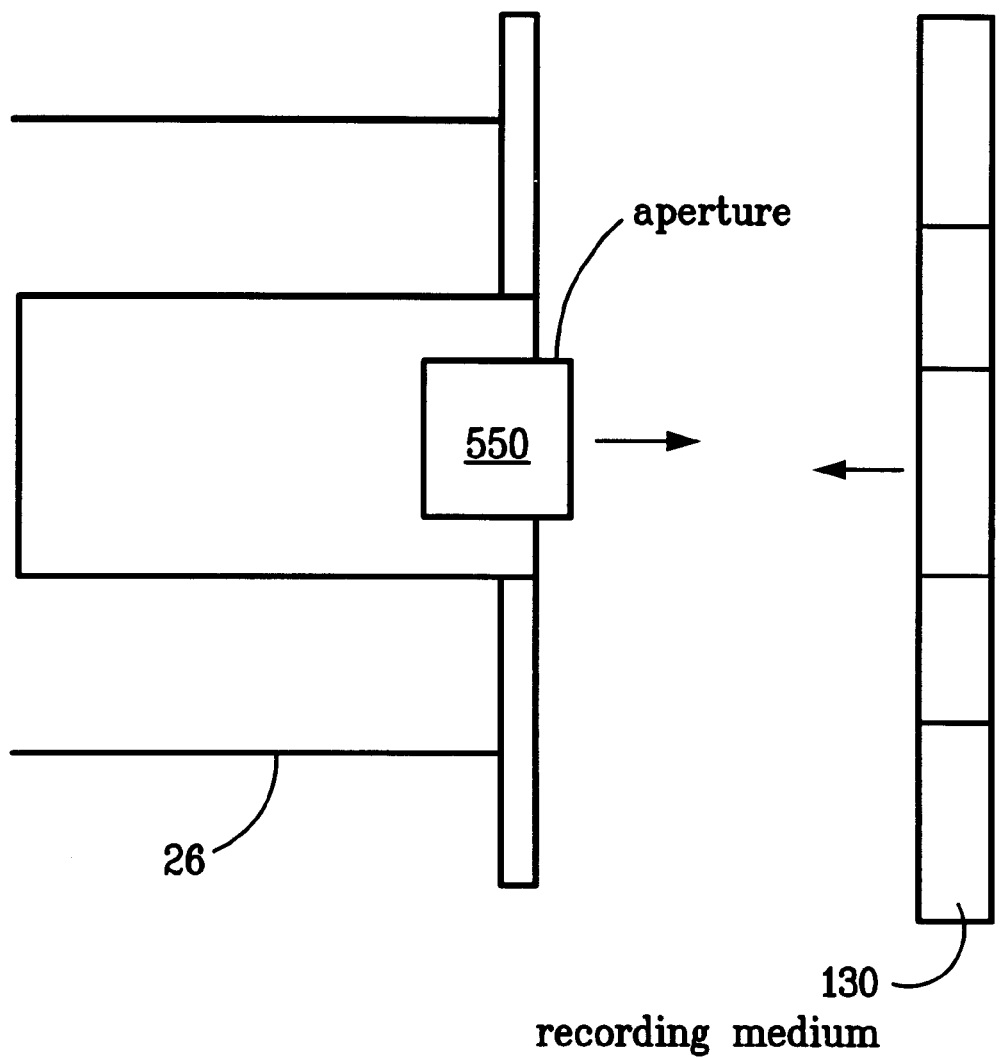

Another method of implementing a near-field laser diode with a sub-wavelength aperture is through use of a tapered ridge waveguide. As illustrated by FIG. 5H, an optical writing apparatus 26 has a laser diode 541 which emits light along a waveguide 544. Optical writing apparatus 26 has an active layer 543 and an etched groove 542. Etched groove 542 can separate an optical element e.g., a photo diode for light detection, from the laser diode 541. By removal of sections 545 from laser diode 541, a thin ridge 540 is formed narrower than the rest of waveguide 544 for emitting a laser beam capable of small spot sizes. This tapered ridge 540 has a sub-wavelength aperture 546 according to the present embodiment for optically writing servo fields via a near-field regime.

Figure 6:
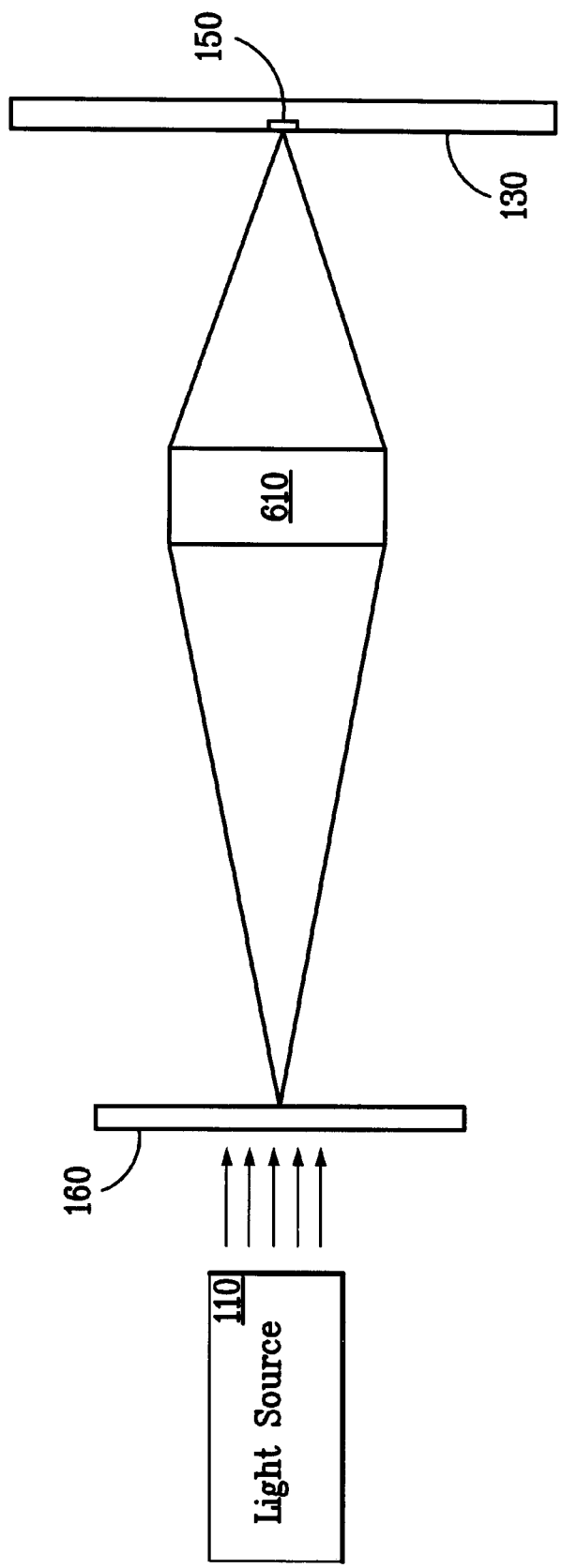
FIG. 6 represents an embodiment of the present invention for optically writing servo fields using an optical mask and lithographic techniques.

In another embodiment of the present invention, optical servo fields are written with an optical mask and lithographic methods. As illustrated in FIG. 6, a light source 110 illuminates an optical mask 600 with a predetermined and pre-manufactured optical pattern. The light passes through optical mask 600 with an intensity which corresponds to the predefined pattern thereon. In this embodiment, the pattern on optical mask 600 corresponds to the preselected positions for optical servo fields 150 on optical medium 130. Thus, for a particular portion of optical medium 130 where a servo field is not applicable, e.g., on a data track of optical medium 130, light does not pass through optical mask 600 or passes through with minimal intensity. Once light has passed through optical mask 600 for forming a servo field 150, it is focused onto optical medium 130 by optical system 610. Optical 610 can be a camera, a system of lens, or any system suitable for focusing an image onto an image plane. Optical mask 600 can be moved such that its optical pattern can be duplicated. In this manner, optical servo fields can be created on an optical medium 130.

In another embodiment of the present invention, a lithographically imaged radial pattern of optical servo fields are created by synchronous pulsing of a laser source, such as an excimer (UV) laser source.

Figure 7A:
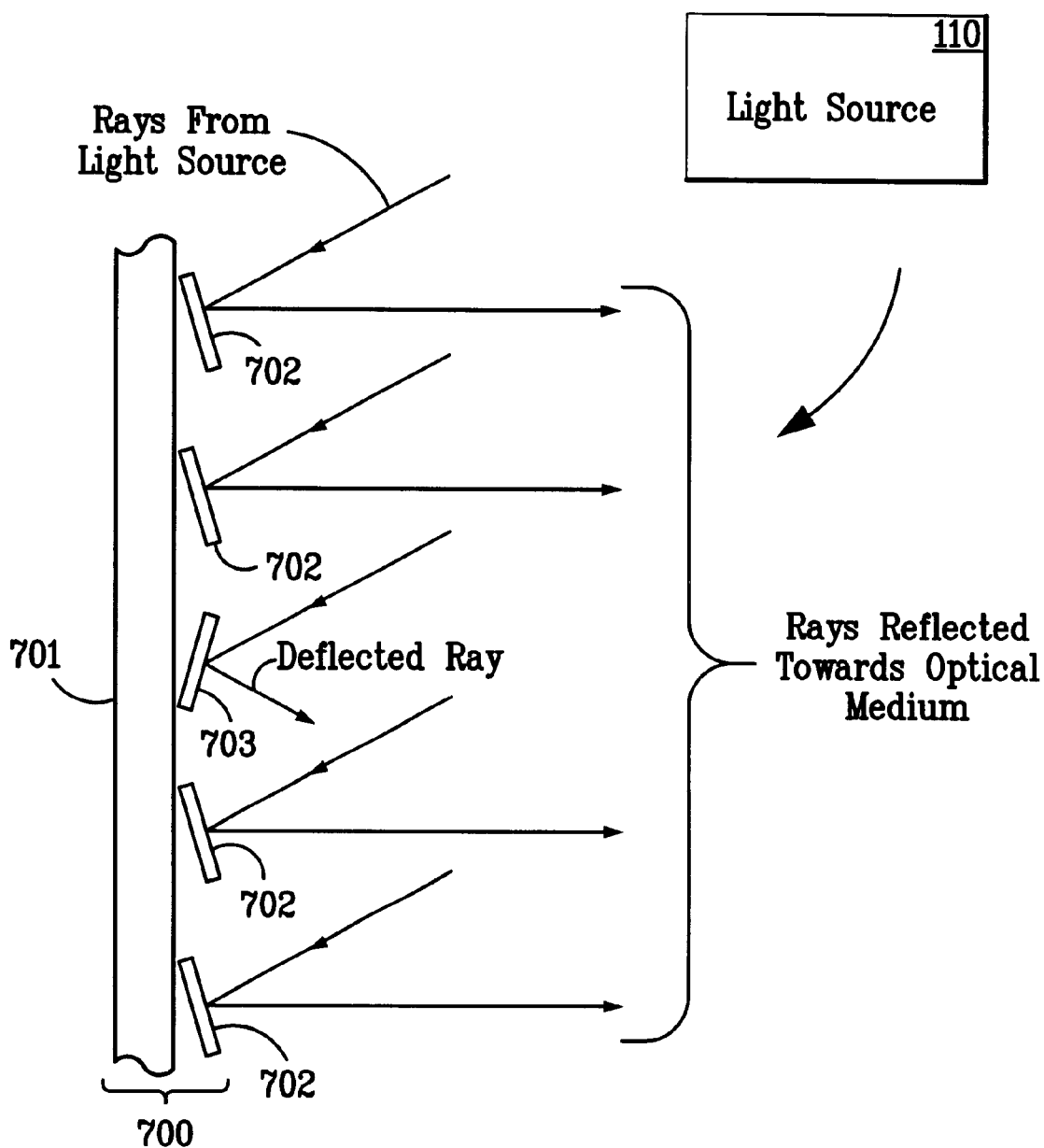
FIGS. 7A, 7B and 7C represent an embodiment of the present invention for optically writing servo fields using maskless lithography.
Figure 7B:
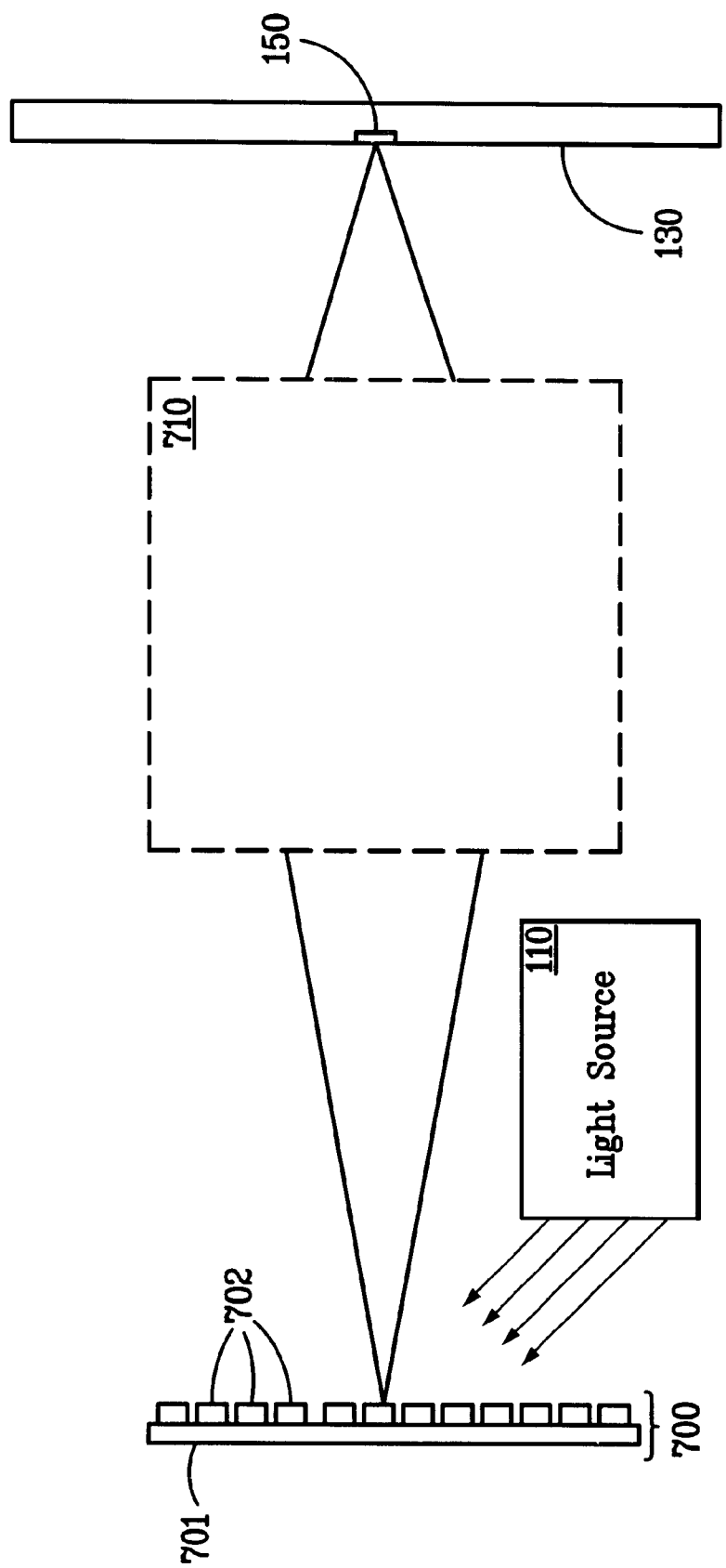

In another embodiment of the present invention, optical servo fields are written using maskless lithography techniques. In maskless lithography, the superposition of plane waves creates a complex phase and amplitude pattern which can be used to optically write servo fields. By predetermining the position of servo fields to be placed on an optical medium, a phased array of mirrors can control reflection of beam of lights to create the predetermined pattern of servo fields. As demonstrated by FIG. 7A, rays from a light source 110 are directed to an array 700 with a substrate 701 and mirrors 702 and 703. Where a servo field is desired light is directed towards the optical medium with properly angled mirrors 702. Where a servo field is not desired, light is angled away from the medium with angled mirror 703. As seen from FIG. 7B, a light source 110 directs light towards array 700 with substrate 701 and mirrors 702. Where a servo field is to be written, light is directed to optical system 710 for focusing light onto optical medium 130 to write servo field 150. Optical system 710 can be a camera, a system of lens, or any other system capable of focusing an image onto an image plane. Then, the focused light beam optically writes optical servo field 150.

Figure 7C:
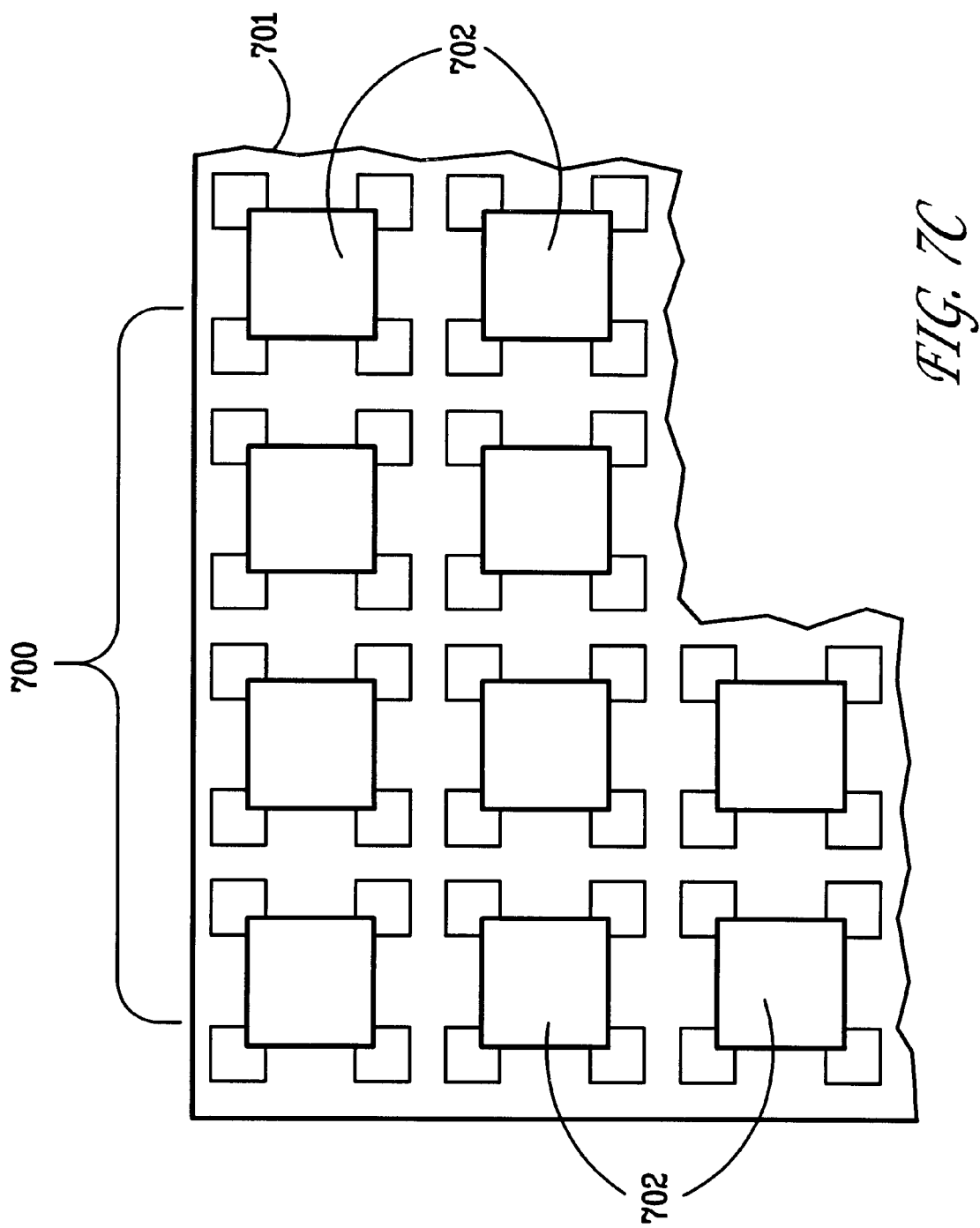

FIG. 7C shows an example of an array of mirrors according to the present embodiment. Array 700 has substrate 701 with mirrors 702 positioned thereon. By angling mirrors 702, an image can be created corresponding to servo fields. Therefore, through angulation of different mirrors, a preselected pattern of servo fields 150 can be optically written onto an optical medium. While the present invention has been described in connection with the preferred embodiments of the various figures, it is to be understood that other similar embodiments may be used or modifications and additions may be made to the described embodiment for performing the same function of the present invention without deviating therefrom. For example, in many optical situations, space or design restraints may require something other than a linear path. In these instances, a linear laser beam path could employ a beam splitter or other well known optical waveguides for purposes of changing the geometry of a light path. For example, one could use mirrors to bend a straight path or to separate the path of a reflected light ray from an incident light ray. Additionally, a variety of collimating optics can be employed including, but not limited to such elements as a laser collimating pen, a collimating or correction lens, an imaging lens or objective lenses.

It is also to be understood that it is not necessary to limit the configuration of optical servo fields to discrete fields. A continuous ring of optical servo fields could be used or any configuration which matches the geometry of a data path could be used. Therefore, the present invention should not be limited to any single embodiment, but rather construed in breadth and scope in accordance with the recitation of the appended claims.

What is claimed is:

1. A method for servo writing a medium, comprising:
defining a data path by transmitting a laser beam onto the medium to create a set of servo fields thereon, and
changing an optical quality of at least one portion of the servo fields with said laser beam by altering the crystalline structure into an over-amorphized state in at least one portion of said servo fields.

2. The method of claim 1, wherein portions of said data path are transmutable to a first state produced by a first power of an optical servo writer and transmutable to a second state produced by a second power of the optical servo writer, and said portions of said servo fields are produced by a third power of the optical servo writer.

3. The method of claim 2, wherein a metastable crystalline phase is used for data in said first and second portions.

4. The method of claim 2, wherein the third power is greater than said first and second powers.

5. The method of claim 2, wherein a metastable crystalline phase is used for data in said first and second portions.

6. The method of claim 1, wherein the change in optical quality of said at least one, portion of said servo fields is a lengthening of atomic diffusion lengths for said portions of the substrate.

7. The method of claim 1, wherein the change in optical quality of said at least one portion of said servo fields is changed by using faster cycle transitioning.

8. A method according to claim 1, further comprising:
using a far-field laser servo writer to transmit a laser beam in combination with a high numerical aperture focusing lens to achieve spot sizes of a predetermined width,
modulating the laser beam from said laser servo writer to achieve a preselected wavelength, and
using an active focus servo to achieve a preselected focal distance.

9. A method according to claim 7, wherein the spot size is under 300 nm.

10. A method according to claim 7, wherein the laser is modulated using an acousto-optical modulator.

11. A method according to claim 7, wherein the laser is modulated using an electro-optical modulator.

12. A method according to claim 7, wherein said far field laser servo writer uses a blue gas laser.

13. A method according to claim 11, wherein said blue gas laser is a HeCd laser.

14. A method according to claim 11, wherein said blue gas laser is an $Ar^+$ laser.

15. A method according to claim 1, further comprising:
using a far-field laser servo writer to transmit a laser beam in combination with a solid immersion lens to achieve spot sizes of a predetermined width,
modulating the laser beam from said laser servo writer to achieve a preselected wavelength, and
using an active focus servo to achieve a preselected focal distance.

16. A method according to claim 1, further comprising:
using a near-field laser servo writer to emit a laser beam in combination with a solid immersion lens to achieve spot sizes of a predetermined width,
modulating the laser beam from said laser servo writer to achieve a preselected wavelength, and
maintaining said solid immersion lens a predetermined distance from said medium.

17. A method according to claim 1, further comprising:
using a sub-wavelength aperture laser for emitting a laser beam onto said medium.

18. A method according to claim 16, wherein said sub-wavelength aperture is created by etching.

19. A method according to claim 16, wherein said sub-wavelength aperture is implemented with a tapered pipette.

20. A method according to claim 16, wherein said sub-wavelength aperture is implemented with a tapered fiber.

21. A method according to claim 16, wherein said sub-wavelength aperture is implemented with a tapered waveguide.

22. A method according to claim 16, wherein said sub-wavelength aperture is implemented with a tapered ridged waveguide laser.

23. A method according to claim 16, wherein said sub-wavelength aperture is located on the output laser facet of a laser diode.

24. A method according to claim 22, wherein said laser diode has a non-uniform emission face.

25. A method according to claim 1, further comprising:
positioning an optical mask on said medium and
using optical lithographic techniques to change the crystalline structure of the medium at portions corresponding to said optical mask.

26. A method according to claim 1, further comprising:
controlling the phase and magnitude of plane waves,
transmitting selected plane waves in the direction of a medium,
superposing said plane waves to reconstruct a complex phase and amplitude object, and
changing the crystalline structure of the medium at portions corresponding to changes in said complex phase and amplitude object.

27. A data storage medium made according to the steps recited in claim 1.

28. A data storage medium made according to the steps recited in claim 7.

29. A data storage medium made according to the steps recited in claim 14.

30. A data storage medium made according to the steps recited in claim 15.

31. A data storage medium made according to the steps recited in claim 16.

32. A data storage medium made according to the steps recited in claim 24.

33. A data storage medium made according to the steps recited in claim 25.

34. A data storage medium for the storage of data, having a substrate,
a plurality of data tracks for the storage of data to be read by an optical apparatus, and
optical servo fields, adjacent to said data tracks, having a crystalline structure that is characterized by an over-amorphized state.

35. A data storage medium for use with an optical apparatus, comprising:
- a substrate,
- a plurality of data tracks arranged concentrically on said substrate, and
- a plurality of servo fields arranged along at least one data track wherein said servo fields are formed by changing the crystalline structure of the substrate into an over-amorphized state.

36. A data storage medium according to claim 35, wherein said plurality of servo fields are arranged along said plurality of data tracks in a known position.

37. A data storage medium according to claim 36, wherein some of said plurality of servo fields are arranged as A fields a predetermined distance away from a data track on one side of the data track, some of said plurality of servo fields are arranged as B fields a predetermined distance away from the data track on the other side of the data track, and some of said plurality of servo fields are arranged as C fields on the data track.

38. A method of laser sevo writing servo fields onto a data storage medium, comprising:
- inputting data into a control unit,
- processing said data in a processing unit of the control unit,
- storing information in a memory of the control unit,
- outputting a control signal from the control unit to an actuator for moving an optical writing apparatus,
- outputting a control signal from the control unit to the optical writing apparatus for controlling the output of the a transmitted laser beam from the optical writing apparatus, and
- transmitting a laser in the direction of the medium to change the crystalline structure of portions of the medium into an over-amorphized state corresponding to preselected positions for optical servo fields.

* * * * *